(12) United States Patent
Lyszus et al.

(10) Patent No.: US 10,826,496 B2
(45) Date of Patent: Nov. 3, 2020

(54) OPERATOR CONTROL DEVICE, IN PARTICULAR FOR AN ELECTRONIC DOMESTIC APPLIANCE AND ELECTRONIC DOMESTIC APPLIANCE

(71) Applicant: DIEHL AKO STIFTUNG & CO. KG, Wangen (DE)

(72) Inventors: Joachim Lyszus, Baindt (DE); Bruno Fuhge, Achberg (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 198 days.

(21) Appl. No.: 16/156,358

(22) Filed: Oct. 10, 2018

(65) Prior Publication Data

US 2019/0109592 A1 Apr. 11, 2019

(30) Foreign Application Priority Data

Oct. 10, 2017 (DE) .......................... 10 2017 009 377

(51) Int. Cl.
*H03K 17/968* (2006.01)
*F24C 7/08* (2006.01)

(52) U.S. Cl.
CPC .............. *H03K 17/968* (2013.01); *F24C 7/08* (2013.01); *H03K 2217/94063* (2013.01)

(58) Field of Classification Search
CPC ....... H03K 17/968; H03K 2217/94063; H03K 2217/94057; H03K 17/965; F24C 7/08; F24C 7/086

USPC .......................................... 359/522; 219/482
See application file for complete search history.

(56) References Cited

U.S. PATENT DOCUMENTS

2010/0012647 A1* 1/2010 Baier ................. G01D 5/34776
219/482

FOREIGN PATENT DOCUMENTS

DE 102004013947 B3 12/2015

* cited by examiner

*Primary Examiner* — Rexford N Barnie
*Assistant Examiner* — Thai H Tran
(74) *Attorney, Agent, or Firm* — Laurence A. Greenberg; Werner H. Stemer; Ralph E. Locher

(57) ABSTRACT

An operator control device has a control panel with a user side facing a user and an inner side facing away from the user. The control panel has an operator control element region. A rotary knob is positioned on the user side of the control panel in the region of the operator control element region and can be rotated about a rotational axis. The rotary knob is detachably attached to the control panel and has an encoder block with a code section which is at a distance, changing along the circumferential direction, from a lower end side, facing the control panel, of the rotary knob. An optical sensor is arranged on the inner side of the control panel in the region of the operator control element region and is configured to sense a distance between the optical sensor and the code section of the encoder block by electromagnetic radiation.

9 Claims, 3 Drawing Sheets

OPERATOR CONTROL DEVICE, IN PARTICULAR FOR AN ELECTRONIC DOMESTIC APPLIANCE AND ELECTRONIC DOMESTIC APPLIANCE

CROSS-REFERENCE TO RELATED APPLICATION

This application claims the priority, under 35 U.S.C. § 119, of German application DE 10 2017 009 377.6, filed Oct. 10, 2017; the prior application is herewith incorporated by reference in its entirety.

BACKGROUND OF THE INVENTION

Field of the Invention

The present invention relates to an operator control device, in particular to an operator control device for electronic domestic appliances, and in particular to an operator control device having an operator control element in the form of a rotary toggle.

In electronic domestic appliances, rotary toggles are often used in operator control devices with which toggles a user can set a desired value of a parameter, for example a cooking setting, a cooking time, a washing program or the like, by rotating the rotary toggle.

German patent DE 10 2004 013 947 B3 discloses an operator control device for a glass ceramic hob having an operator control element in the form of a rotary toggle, in which operator control device the rotary toggle is positioned on the user side of the glass ceramic hob, and a measuring strip which is arranged on a circular path and which has physical properties which change continuously or incrementally along the circular path and which can be sensed by a sensor positioned on the inner side of the glass ceramic hob is provided on the underside of the rotary toggle. If the measuring strip has a changing reflectivity, this can be sensed by an optical infrared sensor; and if the measuring strip which is composed of an electrically conductive material has a changing thickness or is at a changing distance from the underside, the thickness or distance can be sensed by a capacitive sensor. In one configuration variant, the rotary toggle has a first holding magnet, and the glass ceramic hob has a second holding magnet, so that the rotary toggle can be detachably fastened to the glass ceramic hob.

SUMMARY OF THE INVENTION

The invention is based on the object of providing an improved operator control device having an operator control element in the form of a rotary toggle.

This object is achieved by means of an operator control device having the features of the main patent claim. Particularly preferred refinements and developments of the invention are the subject matter of the dependent claims.

The operator control device according to the present invention has: a control panel with a user side facing a user and an inner side facing away from a user, wherein the control panel has an operator control element region. A rotary knob is positioned on the user side of the control panel in the region of the operator control element region thereof and can be rotated about a rotational axis. The rotary knob is detachably attached to the control panel and has an encoder block with a circular or circular-ring-shaped code section which is at a distance, changing along the circumferential direction, from a lower end side, facing the control panel, of the rotary knob. At least one optical sensor is arranged on the inner side of the control panel in the region of the operator control element region thereof and is configured to sense a distance between the optical sensor and the code section of the encoder block by means of electromagnetic radiation. The control panel is configured in a closed fashion in the region of the operator control element region and is configured to be at least partially transparent with respect to the electromagnetic radiation used by the optical sensor. The code section of the encoder block is configured to be at least partially reflective with respect to the electromagnetic radiation used by the optical sensor.

The operator control device according to the invention is suitable, for example, for touch control operator control panels of electronic domestic appliances. The operator control device according to the invention is distinguished by a simple design and simple operator control by a user. The control panel which is configured in a closed fashion and the detachable attachment of the rotary knob on the user side of the control panel permit the user to clean the control panel easily and protect the electronics on the inner side of the control panel. The combination of the encoder block with the code section with a changing distance (continuously or incrementally), along the circumferential direction, from the underside of the rotary knob and of the optical distance sensor on the inner side of the control panel forms a simple and compact design and permits precise and reliable sensing of a rotational movement and/or rotational position of the rotary knob on the control panel.

The optical sensor uses electromagnetic radiation, preferably infrared radiation, for the distance measurement. The encoder block is preferably fabricated from a plastic material. The optical sensor is preferably mounted on a carrier plate, in particular a circuit board, which is arranged on the inner side of the control panel. The carrier plate is preferably provided with or connected to an evaluation unit which evaluates the measurement signals of the optical sensor. The accuracy and the reliability of the distance measurement can be increased by a preferred use of two or more optical sensors.

On the basis of the measurement signals generated by the optical sensor it is possible optionally to determine the size of and/or change in one or more of the following parameters of an activation of the rotary knob: absolute rotational position, relative rotational position, direction of rotation, and rotational speed. It is also possible to determine whether the detachable rotary knob is located in the operator control element region of the control panel or whether the rotary knob has been removed from the operator control element region.

The reflective property of the code section is preferably achieved by selection of a material of the encoder block and/or a surface condition (e.g. coating, roughening, etc.) of the underside of the code section. The reflective capability of the code section is preferably at least approximately 50%, more preferably at least approximately 75%. The control panel is preferably a (semi-) transparent panel made, for example, of glass, glass ceramic or plastic. The degree of transmission of the control panel is preferably at least approximately 50%, more preferably at least approximately 75%. The optical properties which are necessary for the functional capability of the operator control device must be present in the control panel, at least in the region of the operator control element region thereof; in regions outside the operator control element region the control panel can optionally also have different optical properties and be fabricated, for example, from a different material.

In one refinement of the invention, the control panel has a profile section which projects outwards in the direction of the user side and/or is set back inwards in the direction of the inner side. In this refinement, the rotary knob preferably has a profile which is in engagement with the profile section of the control panel in order to position the rotary knob at a predefined position in the region of the operator control element region of the control panel. As a result of the interplay of the profile of the rotary knob and the profile section of the control panel the rotary knob can be easily and reliably positioned at a predefined position on the control panel. It is therefore possible easily to ensure the method of operation of the optical distance sensor, since the code section and the optical sensor are always positioned correctly relative to one another. Since the rotary knob is positioned and secured in directions parallel to the plane of the control panel by the profiles, it is possible to dispense with additional attachment measures. The profile section of the control panel is preferably configured so as to be essentially rotationally symmetrical with respect to the rotational axis of the rotary knob.

In one refinement of the invention, the rotary knob has a sheath which at least partially surrounds the encoder block in the circumferential direction and forms the profile of the rotary knob. As a result of the separation of encoder block and profile formation it is possible to use an embodiment of the encoder block for different profile sections of control panels. As a result of the separation of encoder block and the profile formation profile can be formed independently of the encoder block with sufficient stability. The sheath can basically be fabricated from any desired material. The sheath is preferably configured essentially in the form of a tube or sleeve. In addition to the function of the profile formation, the sheath can also serve to form haptics and/or a design of the rotary knob. The sheath is preferably connected for example bonded and/or clamped with a press fit, to the encoder block in a rotationally fixed fashion.

In a further refinement of the invention, at least one light source which emits light in the visible wavelength range is arranged on the inner side of the control panel in the region of the operator control element region thereof. In this refinement, the control panel is configured in the region of the operator control element region to be at least partially transparent, preferably with respect to the light emitted by the light source, and the encoder block of the rotary knob has a circular or circular-ring-shaped lighting section which is configured to be at least partially transparent with respect to the light emitted by the light source.

In this refinement, information, for example relating to the status of the operator control device or of the domestic appliance, can be displayed to the user by means of the light source. The electronics necessary for this are located completely on the inner side of the control panel, and the rotary knob can also be configured in a very simple way in this refinement. The light source is preferably a light emitting diode or light emitting diode group. The light source is preferably mounted on the carrier plate, which also bears the optical sensor. The degree of transmission of the control panel is preferably at least approximately 50%, more preferably at least approximately 75%. The degree of transmission of the lighting section is preferably at least approximately 50%, more preferably at least approximately 75%.

In this illuminated refinement of the operator control device according to the invention, the code section and the lighting section of the encoder block preferably have different diameters in the radial direction transversely with respect to the rotational axis of the rotary knob, in order to spatially separate the functionalities of the optical distance measurement and of the lighting. The specified diameter can be the inner diameter, the outer diameter or the middle diameter of the respective section. The code section and the lighting section preferably do not overlap one another in the radial direction; however, an overlap does not have to be completely ruled out.

In the illuminated refinement of the operator control device according to the invention, preferably masking which is configured to be non-transparent with respect to the light emitted by the light source is further provided on the user side and/or the inner side of the control panel in the region of the operator control element region thereof, in order to limit the light emitted by the light source in the direction of the encoder block of the rotary knob. If there are a plurality of light sources, the light emitted thereby can be separated by the masking, in order e.g. to prevent crosstalk. The masking is preferably a printed foil or an injection molded light frame in the operator control element region of the control panel.

In the illuminated refinement of the operator control device according to the invention, alternatively or additionally further masking which is configured to be non-transparent with respect to the light emitted by the light source can be provided on an upper side, facing the user, of the encoder block. By means of this further masking it is possible to form symbols or the like which can be backlit by the light source. With the symbols, for example the function of the respective rotary knob can be displayed to the user.

In a further refinement of the invention, the encoder block of the rotary knob has a central cutout in which a first holding magnet is arranged, and a second holding magnet is arranged on the inner side of the control panel in the region opposite the first holding magnet. By means of the two holding magnets, the rotary knob can be secured, with a complementary effect to the profiles which are in engagement with one another, on the user side of the control panel, wherein this secured connection is configured in a detachable fashion.

The subject matter of the invention is also an electronic domestic appliance having at least one operator control device according to the invention, as described above. The electronic domestic appliance is, for example, a hob, a cooker, a microwave oven, a dishwasher, a washing treatment device or the like.

Other features which are considered as characteristic for the invention are set forth in the appended claims.

Although the invention is illustrated and described herein as embodied in an operator control device, in particular for an electronic domestic appliance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

DETAILED DESCRIPTION OF THE INVENTION

Figure 1:
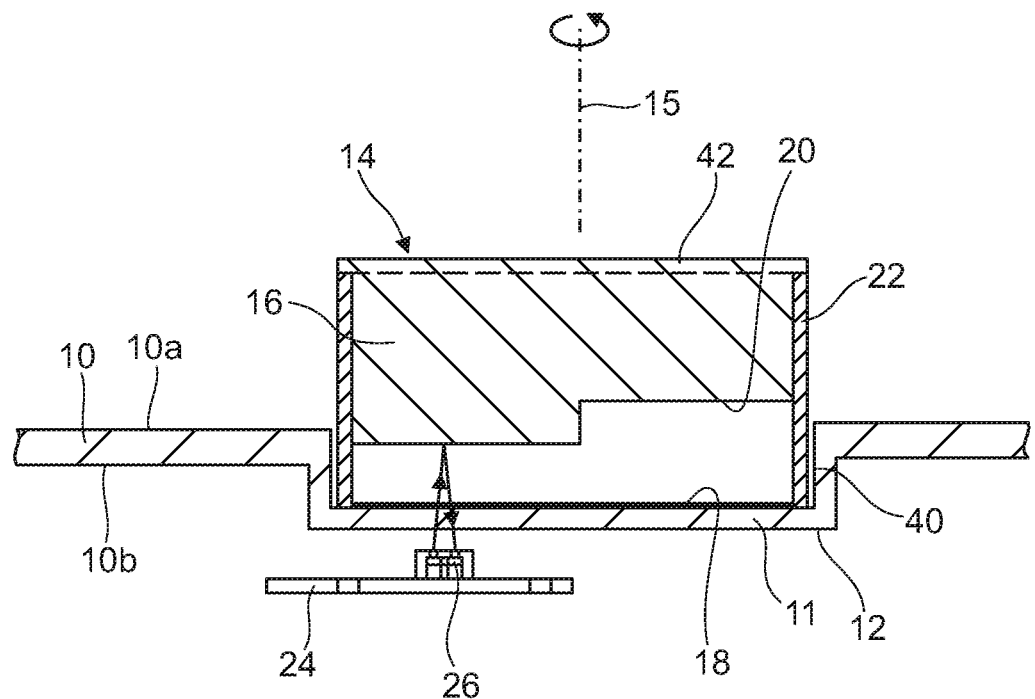
FIG. 1 is a diagrammatic, sectional view of an operator control device according to a first exemplary embodiment of the present invention.

Referring now to the figures of the drawings in detail and first, particularly to FIG. 1 thereof, there is shown a first exemplary embodiment of an operator control device according to the invention.

The operator control device has a control panel 10, for example, in the form of a glass plate or glass ceramic plate. Alternatively, the control panel 10 can be a transparent or a semi-transparent plastic. The control panel 10 has a user side 10a (at the top in FIG. 1) facing the user, and an inner side 10b (at the bottom in FIG. 1) facing away from the user. Furthermore, the control panel 10 defines an operator control element region 11 in which an operator control element in the form of a rotary knob 14 is positioned.

In the exemplary embodiment in FIG. 1, the control panel 10 has a profile section 12 which is set back inwards in the direction of the inner side 10b. The profile section 12 is configured in a circular shape and has a uniform depth. The profile section 12 which is set back inwards in FIG. 1 can also be referred to as a depression.

The control panel 10 is embodied in a closed-fashion (that is to say it does not have any breakthroughs) in its operator control element region 11—and optionally also outside the operator control element region 11.

The rotary knob 14 is inserted in a detachable fashion into the profile section 12 and is therefore located at a predefined position on the user side 10a of the control panel 10. The rotary knob 14 can be rotated about a rotational axis 15 which runs essentially perpendicularly with respect to the plane of the control panel 10 (i.e. parallel to the upwards direction/downwards direction in FIG. 1). In this context, the rotary knob 14 has a profile 40 (an external profile in the exemplary embodiment in FIG. 1) which is in engagement with the profile section 12 of the control panel 10. The profile 40 of the rotary knob 14 preferably has an outer diameter which is dimensioned to be only somewhat smaller than the inner diameter of the profile section 12 of the control panel 10, in order to position the rotary knob 14 in an accurately positioned fashion on the control panel 10.

The rotary knob 14 is composed essentially of an encoder block 16 which is circular in a plan view (from above in FIG. 1), is composed of a plastic material and a tubular sheath 22, made for example from plastic or metal, which sheath surrounds the encoder block 16 in the circumferential direction. The encoder block 16 is inserted with a press fit into the sheath 22 and is optionally additionally bonded to the sheath 22, so that the sheath 22 is rotationally fixed relative to the encoder block 16. That is to say when the sheath 22 is rotated by a user, the encoder block 16 rotates along with the sheath 22.

In the exemplary embodiment in FIG. 1, the encoder block 16 has a circular code section 20. The code section 20 is formed by milling out the encoder block 16 from its underside facing the control panel 10. This is done in such a way that the code section 20 is at a—continuously or incrementally—changing distance from the lower end side 18 of the rotary knob 14. Furthermore, the lower side of the code section 20, facing the control panel 10, is configured to be IR reflective, for example coated.

On the inner side 10b of the control panel 10, a carrier plate 24, for example in the form of a circuit board, is arranged at a distance therefrom. At least one optical sensor 26 is mounted on this carrier plate 24. The optical sensor 26 is located in the region of the operator control element region 11 of the control panel 10, at a location opposite the code section 20 of the encoder block 16 of the rotary knob. Two or more optical sensors 26 can also optionally be provided on the carrier plate 24 along the circumferential direction of the code section 20.

The at least one optical sensor 26 is configured in such a way that it senses, by means of infrared radiation, a distance between the sensor 26 and the lower side, lying opposite the latter, of the code section 20. For this purpose, the control panel 10 is configured to be at least partially IR transmissive in the region of its operator control element region 11. The sensing of the distance is carried out, for example, on the basis of a changed intensity and/or a changed sensing location and/or a changed sensing time of the radiation which is reflected at the code section 20 and sensed by the optical sensor 26.

By rotating the rotary knob 14 about its rotational axis 15, the code section 20 of the encoder block 16 is rotated, so that the distance of the code section 20 from the optical sensor 26 on the angular section in which the optical sensor 26 is located changes. By sensing the change in this distance by means of the optical sensor 26 it is possible to determine a rotational movement (direction of rotation, rotational speed) of the rotary knob 14 and/or an (absolute or relative) rotational position of the rotary knob 14. This is done, for example, by means of an evaluation unit which is connected to the optical sensor for receiving its measurement signals and which passes on the evaluation results to an appliance controller.

Figure 2:
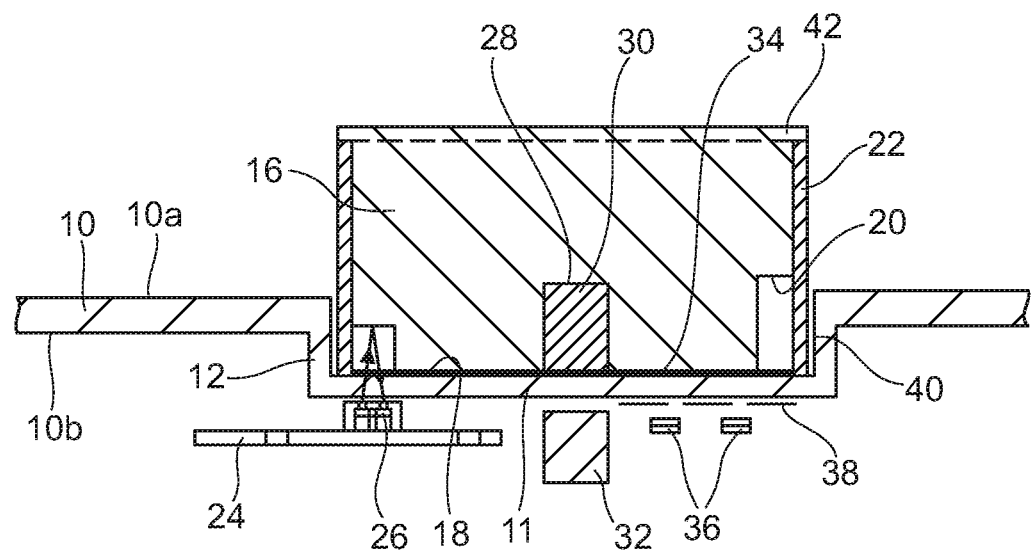
FIG. 2 is a sectional view of the operator control device according to a second exemplary embodiment of the present invention.

FIG. 2 shows a first exemplary embodiment of an operator control device according to the invention in which a plurality of variants of the first exemplary embodiment are implemented. The variants which are shown in FIG. 2 can be provided individually or in a combination of a multiple thereof.

As a first variant, the code section 20 of the encoder block 16 of the rotary knob 14 is configured in a circular-ring shape (in a plan view from above). The code section 20 is preferably provided in the outer diameter region of the encoder block 16, so that a rotational angle of the rotary knob 14 results in the largest possible stretching movement of the code section 20, as a result of which the measuring accuracy of the optical sensor 26 can be increased. The at least one optical sensor 26 is correspondingly also arranged further towards the outside in the region of the operator control element region 11, in order to lie opposite the code section 20.

As a second variant, the encoder block 16 has a central cutout 28 on its lower side. In this cutout 28, a first holding magnet 30 is accommodated. A second holding magnet 32 is arranged essentially centrally in the region of its operator control element region 11, on the inner side 10b of the control panel 10. The rotary knob 14 is also detachably held by the magnetic attraction between the two holding magnets 30, 32 in a direction parallel to the rotational axis 15 on the user side 10a of the control panel 10.

As a third variant, the operator control device in FIG. 2 has a plurality of light sources 36 (e.g. light-emitting diodes or light-emitting diode groups) which are arranged on the inner side 10b of the control panel 10 in the region of the operator control element region 11 thereof. These light sources 36 can also optionally be mounted on the carrier plate 24 which carries the at least one optical sensor 26. The light sources 36 are positioned in the radial direction perpendicularly with respect to the rotational axis 15 of the rotary knob 14, at different distances from the rotational axis 15. The light sources 26 emit light in the wavelength range which is visible (to the human eye) in the direction of the control panel 10 and of the rotary knob 14. The control panel 10 is therefore configured to be at least partially translucent or transparent in the region of its operator control element region 11, so that the light emitted by the light sources 36 can pass through the control panel 10.

In this third variant, the encoder block 16 of the rotary knob 14 has, in addition to the code section 20, a lighting section 34 which is circular-ring-shaped (in a plan view from above). The encoder block 16 is configured to be at least partially translucent in this lighting section 34, so that the light emitted by the light sources 36 can also pass through the encoder block 16. The lighting section 34 is provided in the radial direction perpendicularly with respect to the rotational axis 15 between the (optional) cutout 28 for the first holding magnet 30 and the code section 20 (i.e. has a different radius/diameter than these components). These light sources 36 can be used to illuminate the rotary knob 14 in order to make the rotary knob 14 more easily recognizable to the user or to display, for example, status information to the user. For this purpose, the light sources 36 can, for example, emit light in various colours, emit continuous light or flashing light, and emit flashing light with variable frequencies, or the like.

In one refinement of the third variant, the lighting section 34 can also be provided outside the code section 20 in the radial direction. The light sources 36 and optical sensors 26 are then positioned in a correspondingly changed fashion with respect to these sections 20, 34.

In addition, masking 38 which is non-translucent or non-transparent is optionally provided in the third variant. The masking 38 is provided in the region of the light sources 36 on the user side 10*a* and/or the inner side 10*b* of the control panel 10 (only on the inner side 10*b* in the example in FIG. 2), for example as a printed film. The masking 38 is intended to limit in the radial direction the light which is emitted by the light sources 36 and prevent crosstalk between light from various light sources 36.

In the third variant, further masking 42 can optionally be provided. This masking is located on the upper side of the rotary knob 14 facing the user, in or on the encoder block 16. With this further masking 42 it is possible to generate, for example, illuminated symbols using the light sources 36.

In all the exemplary embodiments and variants the electronic components are located on the inner side 10*b* of the control panel 10, and the rotary knob 14 is constructed in a very simple and compact fashion.

FIGS. 3A-3H show variant embodiments of the profile section 12 of the control panel 10 and of the profile 40, in engagement therewith, of the rotary knob 14.

Figure 3A:
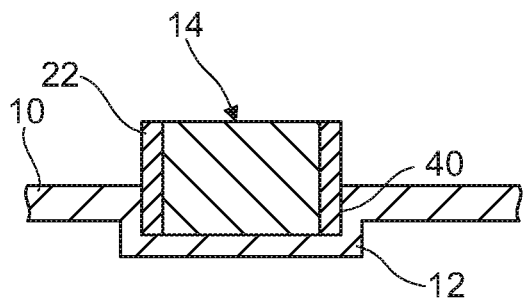
FIGS. 3A-3H are sectional views of a plurality of different embodiment variants of the profile section of the control panel.

The partial FIG. 3A shows the variant corresponding to the exemplary embodiments in FIGS. 1 and 2. That is to say the profile 40 is an external profile of the rotary knob 14 which is formed by the sheath 22 of the rotary knob 14, and the profile section 12 is an inwardly projecting, circular depression of the control panel, wherein the inner diameter of the depression is somewhat larger than the outer diameter of the sheath 22 of the rotary knob 14.

Figure 3B:
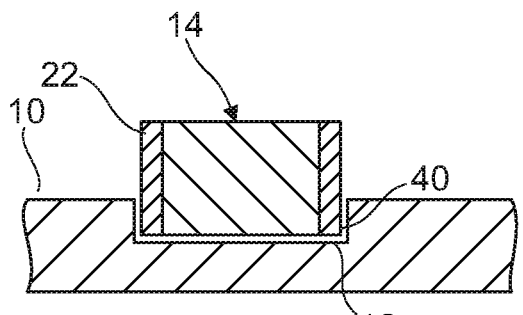

The partial FIG. 3B shows a variant in which the profile 40 is also an external profile of the rotary knob 14 which profile 40 is formed by the sheath 22 of the rotary knob 14, and the profile section 12 is also an inwardly projecting, circular-ring-shaped depression of the control panel 10. The inner diameter of the depression is somewhat larger than the outer diameter of the sheath 22 of the rotary knob 14. In contrast to the embodiment variant in the partial FIG. 3A, the depression 12 is, however, configured within the control panel 10, so that the entire inner side 10*b* of the control panel 10 is planar.

Figure 3C:
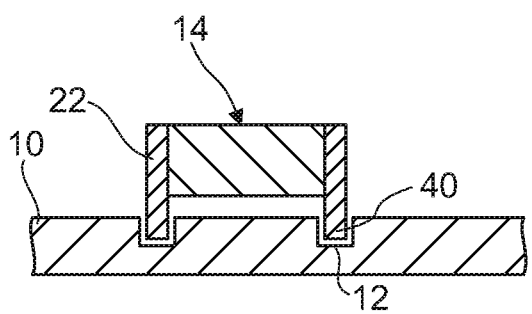

The partial FIG. 3C shows an embodiment variant in which the profile section 12 is an inwardly projecting, circular-ring-shaped depression, and the profile 40 of the rotary knob 14 is formed by the sheath 22 thereof, which sheath 22 protrudes over the encoder block 16 of the rotary knob 14 in the direction of the control panel 10. The thickness of the sheath 22 is dimensioned to be somewhat smaller than the radial width of the circular-ring-shaped profile section 12, and the outer diameter of the profile section 12 is dimensioned to be somewhat larger than the outer diameter of the sheath 22 of the rotary knob 14.

Figure 3D:
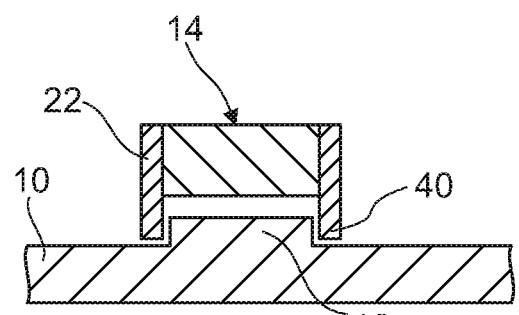

The partial FIG. 3D shows an embodiment variant in which the profile section 12 is an outwardly projecting, circular-shaped raised portion, and the profile 40 of the rotary knob 14 is formed by the sheath 22 thereof, which sheath 22 protrudes over the encoder block 16 of the rotary knob 14 in the direction of the control panel 10. The outer diameter of the profile section 12 is dimensioned to be somewhat smaller than the inner diameter of the sheath 22 of the rotary knob 14.

Figure 3E:
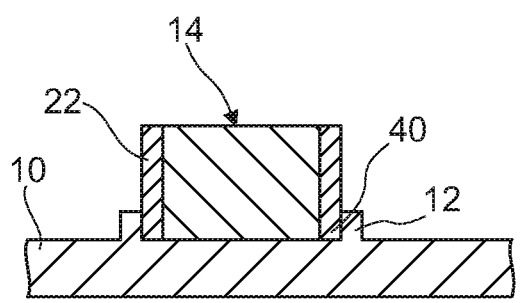

The partial FIG. 3E shows an embodiment variant in which the profile section 12 is an outwardly projecting, circular-ring-shaped raised portion, and the profile 40 is the external profile of the rotary knob 14 which profile is formed by the sheath 22 thereof. The inner diameter of the profile section 12 is dimensioned to be somewhat larger than the outer diameter of the sheath 22 of the rotary knob 14.

Figure 3F:
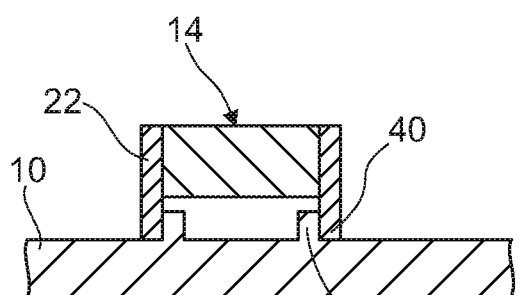

The partial FIG. 3F shows an embodiment variant in which the profile section 12 is an outwardly projecting, circular-ring-shaped raised portion, and the profile 40 of the rotary knob 14 is formed by the sheath 22 thereof, which sheath 22 protrudes beyond the encoder block 16 of the rotary knob 14 in the direction of the control panel 10. The outer diameter of the profile section 12 is dimensioned to be somewhat smaller than the inner diameter of the sheath 22 of the rotary knob 14.

Figure 3G:
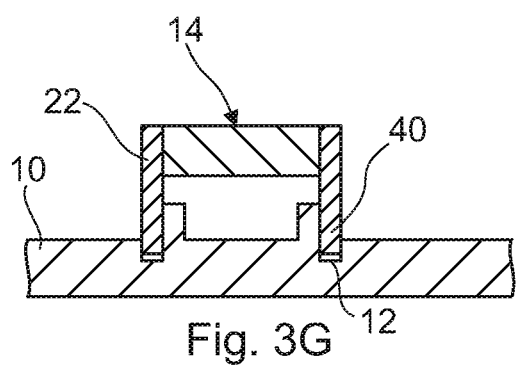

The partial FIG. 3G shows an embodiment variant which constitutes a combination of the two embodiment variants in partial FIGS. 3C and 3D. That is to say the profile section 12 is formed by an inwardly projecting, circular-ring-shaped depression 12, and an outwardly projecting, circular raised portion, wherein the outer diameter of the raised portion corresponds partially to the inner diameter of the depression. The profile 40 of the rotary knob 14 is formed by the sheath 22 thereof, which sheath 22 protrudes beyond the encoder block 16 of the rotary knob 14 in the direction of the control panel 10. The outer diameter of the raised portion of the profile section 12 is dimensioned to be somewhat smaller than the inner diameter of the sheath 22 of the rotary knob 14, and the thickness of the sheath 22 is dimensioned to be somewhat smaller than the radial width of the circular-ring-shaped depression of the profile section 12.

Figure 3H:
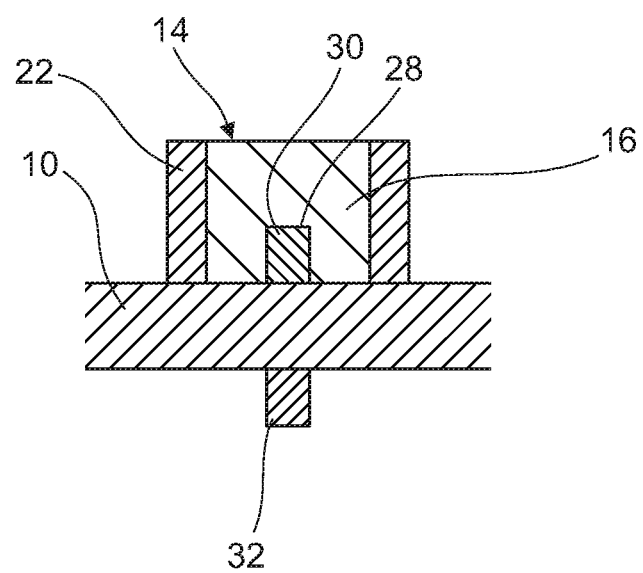

The partial FIG. 3H illustrates an embodiment variant in which the rotary knob 14 has a central cutout 28 on its lower side. A first holding magnet 30 is accommodated in this cutout 28. A second holding magnet 32 is arranged on the inner side 10*b* of the control panel 10, essentially centrally in the region of the operator control element region 11 thereof. The rotary knob 14 is also detachably held on the user side 10a of the control panel 10 in a direction parallel to the rotational axis 15 by the magnetic attraction between the two holding magnets 30, 32. The control panel 10 is flat. It does not have a profile section 12.

The person skilled in the art can recognize further variants within the invention in addition to the embodiment variants shown in partial FIGS. 3A-H.

Furthermore, all the embodiment variants in FIG. 3 can be applied in all the exemplary embodiments in FIGS. 1 and 2 and the variants thereof.

The following is a summary list of reference numerals and the corresponding structure used in the above description of the invention:

10 Control panel
10a User side
10b Inner side
11 Operator control element region
12 Profile section
14 Rotary knob
15 Rotational axis
16 Encoder block
18 Lower end side of 14
20 Code section of 16
22 Sheath
24 Carrier plate, in particular circuit board
26 Optical sensor
28 Cutout
30 First holding magnet
32 Second holding magnet
34 Lighting section
36 Light source
38 Masking
40 Profile of the rotary knob
42 Further masking

The invention claimed is:

1. An operator control device, comprising:
a control panel having a user side facing a user, an inner side facing away from the user, and an operator control element region;
a rotary knob disposed on said user side of said control panel in a region of said operator control element region and can be rotated about a rotational axis, said rotary knob being detachably attached to said control panel and having an encoder block with a circular or circular-ring-shaped code section which is at a distance, changing along a circumferential direction, from a lower end side, facing said control panel, of said rotary knob;
at least one optical sensor disposed on said inner side of said control panel in said region of said operator control element region and configured to sense a distance between said optical sensor and said code section of said encoder block by means of electromagnetic radiation;
said control panel configured in a closed fashion in said region of said operator control element region;
said control panel configured in said region of said operator control element region to be at least partially transparent with respect to the electromagnetic radiation used by said optical sensor; and
said code section of said encoder block configured to be at least partially reflective with respect to the electromagnetic radiation used by said optical sensor.

2. The operator control device according to claim 1, wherein:
said control panel has a profile section which projects outwards in a direction of said user side and/or is set back inwards in a direction of said inner side; and
said rotary knob has a profile which is in engagement with said profile section of said control panel in order to position said rotary knob at a predefined position in said region of said operator control element region of said control panel.

3. The operator control device according to claim 2, wherein said rotary knob has a sheath which at least partially surrounds said encoder block in the circumferential direction and forms said profile of said rotary knob.

4. The operator control device according to claim 1,
further comprising at least one light source emitting light in a visible wavelength range and disposed on said inner side of said control panel in said region of said operator control element region;
wherein said control panel is configured in said region of said operator control element region to be at least partially transparent with respect to the light emitted by said light source; and
wherein said encoder block of said rotary knob has a circular or circular-ring-shaped lighting section which is configured to be at least partially transparent with respect to the light emitted by said light source.

5. The operator control device according to claim 4, wherein said code section and said lighting section of said encoder block have different diameters in a radial direction transversely with respect to the rotational axis of said rotary knob.

6. The operator control device according to claim 4, further comprising a masking configured to be non-transparent with respect to the light emitted by said light source and is disposed on said user side and/or said inner side of said control panel in said region of said operator control element region, in order to limit the light emitted by said light source in a direction of said encoder block of said rotary knob.

7. The operator control device according to claim 6, further comprising a further masking configured to be non-transparent with respect to the light emitted by said light source and is disposed on an upper side, facing the user, of said encoder block.

8. The operator control device according to claim 1,
further comprising a first holding magnet;
wherein said encoder block of said rotary knob has a central cutout formed therein in which said first holding magnet is disposed; and
further comprising a second holding magnet disposed on said inner side of said control panel in a region opposite said first holding magnet.

9. An electronic domestic appliance, comprising:
an operator control device, containing:
a control panel having a user side facing a user, an inner side facing away from the user, and an operator control element region;
a rotary knob disposed on said user side of said control panel in a region of said operator control element region (11) and can be rotated about a rotational axis, said rotary knob being detachably attached to said control panel and having an encoder block with a circular or circular-ring-shaped code section which is at a distance, changing along a circumferential direction, from a lower end side, facing said control panel, of said rotary knob;
at least one optical sensor disposed on said inner side of said control panel in said region of said operator control element region and configured to sense a distance between said optical sensor and said code section of said encoder block by means of electromagnetic radiation;

said control panel configured in a closed fashion in said region of said operator control element region;

said control panel configured in said region of said operator control element region to be at least partially transparent with respect to the electromagnetic radiation used by said optical sensor; and said code section of said encoder block configured to be at least partially reflective with respect to the electromagnetic radiation used by said optical sensor.

\* \* \* \* \*